United States Patent [19]
Takahashi

[11] Patent Number: 6,150,225
[45] Date of Patent: *Nov. 21, 2000

[54] METHOD FOR FABRICATING A SEMICONDUCTOR DEVICE HAVING VERTICAL AND LATERAL TYPE BIPOLAR TRANSISTORS

[75] Inventor: Seiichi Takahashi, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/991,298

[22] Filed: Dec. 16, 1997

[30] Foreign Application Priority Data

Dec. 20, 1996 [JP] Japan .................................. 8-341403

[51] Int. Cl.[7] .................................................. H01L 21/331
[52] U.S. Cl. ........................ 438/357; 438/358; 438/369; 438/370
[58] Field of Search .............................. 257/575; 438/357, 438/358, 369, 370

[56] References Cited

U.S. PATENT DOCUMENTS

| | | | |
|---|---|---|---|
| 4,087,900 | 5/1978 | Yiannoulos | 29/578 |
| 4,940,671 | 7/1990 | Small et al. | 437/31 |
| 5,141,881 | 8/1992 | Takeda et al. | 437/76 |
| 5,163,178 | 11/1992 | Gomi et al. | 257/558 |
| 5,347,156 | 9/1994 | Sakaue | 257/575 |

FOREIGN PATENT DOCUMENTS

| | | |
|---|---|---|
| 59-147458 | 8/1984 | Japan . |
| 1-261865 | 10/1989 | Japan . |

*Primary Examiner*—Olik Chaudhuri
*Assistant Examiner*—Douglas A. Wille
*Attorney, Agent, or Firm*—Foley & Lardner

[57] ABSTRACT

A semiconductor device has a P type semiconductor substrate 1, a vertical type bipolar transistor having an N type base region 4, a lateral type bipolar transistor having an N type base region 4 formed on the semiconductor substrate 1, an N type collector region 7a, and an N type emitter region 8, and a P type insulating diffusion region 7b for isolating between vertical and lateral type bipolar transistors, at least one of collector and emitter regions of the lateral bipolar transistor having substantially same depth of the insulating diffusion region 7b.

2 Claims, 3 Drawing Sheets

METHOD FOR FABRICATING A SEMICONDUCTOR DEVICE HAVING VERTICAL AND LATERAL TYPE BIPOLAR TRANSISTORS

BACKGROUND OF THE INVENTION

1. Field of the Invention

The present invention relates to a semiconductor device and, particularly, to a semiconductor device having a vertical type bipolar transistor and a lateral type bipolar transistor.

2. Description of Related Art

The bipolar transistor has been used widely in almost all fields of semiconductor device covering high operation speed semiconductor integrated circuits to semiconductor integrated circuits of electronic devices for home use, in view of its high operation speed, its high driving performance and its superior analog characteristics.

There are two types of the bipolar transistor, that is, an NPN type bipolar transistor and a PNP type bipolar transistor, and it has been usual in an integrated circuit to use a vertical NPN transistor (referred to as "NPN transistor", hereinafter) having three impurity regions, an emitter, a base and a collector formed in a semiconductor substrate in a depth direction thereof in the order and a lateral PNP transistor (referred to as "L-PNP transistor", hereinafter) which can be formed without necessity of adding any steps to a fabrication steps of the NPN transistor.

FIGS. 4(a) to 4(d) are cross sections of a conventional bipolar integrated circuit having a NPN transistor and an L-PNP transistor, showing fabrication steps thereof in sequence.

First, as shown in FIG. 4(a), an $N^+$ type buried layer 2 and a $P^+$ type buried layer 3 are formed in a $P^-$ type silicon substrate 1 and then an $N^-$ type epitaxial layer 4 is grown thereon. Impurity density and thickness of the epitaxial layer depend upon a breakdown voltage of the transistor and are usually selected in a range $1\times10^{15}$~$1\times10^{17}$ cm$^{-3}$ and in a range 1~10 µm, respectively.

After the formation of the epitaxial layer, a thick oxide film (referred to as "LOCOS oxide film", hereinafter) 5 for separation between semiconductor elements is formed by using usual selective oxidation. Thereafter, $N^+$ type diffusion layers 6a and 6b which finally form a collector lead diffusion layer for the NPN transistor and a base lead diffusion layer of the L-PNP transistor, respectively, are diffused up to the $N^+$ type buried layer 2.

Then, a $P^+$ type insulating diffusion layer 7 for separation between semiconductor elements is diffused up to the $P^+$ type buried layer 3. Boron is ion-injected to a region which finally forms a base of the NPN transistor with using a photo resist 14 as a mask, resulting in a P type base diffusion layer 8. Conditions of the ion injection of boron depend upon the breakdown voltage and performance of the transistor. It is, however, preferable to select injection energy and dose in a range 10~60 KeV and a range $1$~$5\times10^{13}$ cm$^{-2}$, respectively.

Then, as shown in FIG. 4(b), a portion of a thin oxide film on a surface of the base diffusion layer 8 of the NPN transistor is removed and then a polycrystalline silicon layer 9 is deposited thereon to a thickness of 1000~3000 Å. After an N type impurity such as arsenide is added to the polycrystalline silicon layer 9 at high density, an $N^+$ type emitter diffusion layer 10 by heat-treating the wafer in nitrogen atmosphere at 900~1000° C. for about 10 minutes. When the addition of arsenide to the polycrystalline silicon layer is to be performed by ion-injection, the injecting conditions are selected such that injection energy and dose of arsenide are in a range of 50~90 KeV and $0.5$~$2\times10^{16}$ cm$^{-2}$, respectively.

Then, as shown in FIG. 4(c), the polycrystalline silicon layer 10 is shaped to a desired configuration through photolithography and anisotropic plasma etching such that the polycrystalline silicon layer functions as a mask in a subsequent step for forming a $P^-$type graft base (external base) by ion-injection of boron or $BF_2$, as disclosed in Japanese Patent Laid-open sho 59-147458. That is, the polycrystalline silicon layer is etched such that the polycrystalline silicon layer is left on the $N^+$ type emitter diffusion layer 10 of the NPN transistor, the $N^+$ type collector lead diffusion layer 6a and the $N^+$ type base lead diffusion layer 6b of the L-PNP transistor surrounding the $N^+$ type emitter diffusion layer 10 and the $N^-$ type epitaxial layer 4 which becomes a base region of the L-PNP transistor. Therefore, the ion-injection of boron or $BF_2$ for the formation of a $P^+$ type graft base 11a can be done without necessity of selective etching using photo resist. That is, since the etching is performed for a whole surface of the semiconductor wafer, the number of fabrication steps of the semiconductor device can be reduced.

A $P^+$ type emitter diffusion layer 11b and a collector diffusion layer 11c of the L-PNP transistor are formed simultaneously with the formation of the $P^+$ type graft base 11a, although it is not disclosed in the Japanese Patent sho 59-147458.

However, the method of forming a $P^+$ type graft base of an NPN transistor, a $P^+$ type collector and emitter regions of an L-PNP transistor in one step is well known. Conditions of the graft base injection may be injection energy of about 30 KeV and dose of $3$~$5\times10^{15}$ cm$^{-2}$ when boron is used as ion material and may be injection energy of 50~70 KeV and dose of $3$~$5\times10^{15}$ cm$^{-2}$ when $BF_2$ is used as ion material.

Finally, as shown in FIG. 4(d), a usual inter-layer insulating film such as a BPSG film 12 and an aluminum wiring 13 are formed, resulting in the semiconductor device.

In the prior art mentioned above, however, there is a problem that current amplification factor of the L-PNP transistor (referred to as "$h_{FE}$", hereinafter) is small. This is because the $P^+$ type collector diffusion layer of the L-PNP transistor is shallow. In order to solve this problem, Japanese Patent Laid-open Hei 1-261865 proposes to increase $h_{FE}$ by forming the $P^+$ type collector diffusion layer deeper. However, since the $P^+$ type graft base of an NPN transistor, the $P^+$ type collector of the L-PNP transistor are formed in one step as mentioned above, a new problem occurs that, if the $P^+$ type collector diffusion layer of the L-PNP transistor is formed deeper, the graft base of the NPN transistor is also made deeper and a capacitance $C_{JC}$ of a base-collector junction is increased correspondingly, lowering a high frequency characteristics thereof.

In order to make the $P^{31}$ type graft base region deeper with sacrifice of the high frequency characteristics of the NPN transistor, it is necessary to push boron ions which are injected into the wafer to form the graft base region deeper by heat-treatment at relatively high temperature. Such heat-treatment at high temperature may influence on the emitter diffusion layer of the NPN transistor such that the emitter diffusion layer becomes deep too much. As a result, the base becomes too thin and the breakdown voltage between the collector and the emitter is lowered by punch-through. If, in order to prevent the punch-through from occurring, the P type base diffusion layer is preliminarily formed deep, the thickness of the $N^-$ type epitaxial density region becomes small and the breakdown voltage between the collector and the base is lowered by punch-through. As a result, the breakdown voltage between the collector and the emitter is lowered.

On the contrary, if, in order to prevent the punch-through from occurring by preliminarily making the N⁻ type epitaxial layer thick, the P⁺ type collector diffusion layer of the L-PNP transistor is not become deep relatively and a substrate current of the L-PNP transistor is increased. As a result, $h_{FE}$ can not be increased as expected.

Further, in the prior art technology, a layout of elements is difficult since the potential of the polycrystalline silicon layer formed on the base region of the L-PNP transistor must be maintained at the highest potential, that is, a source voltage.

If the polycrystalline silicon layer is left floating, a leakage current may flow between the collector and the emitter due to a capacitive coupling therebetween.

Further, the polycrystalline silicon layer becomes a low potential for some reason, an inversion layer may be produced in a surface of the base region, causing the leakage current to flow between the collector and the emitter, too.

Therefore, it is necessary to provide a wiring such that the potential of the polycrystalline silicon layer of the L-PNP transistor becomes maximum, which causes the layout of the elements to be difficult.

Further, in order to provide the wiring on the polycrystalline silicon layer, a portion of the polycrystalline silicon layer which has an annular or closed shape must be extended onto the LOCOS oxide film. In doing so, a portion of the P⁺ type collector diffusion layer which also has an annular or closed shape is cut out. Therefore, the P⁺ type collector diffusion layer does not completely surround the emitter diffusion layer, causing $h_{FE}$ to be lowered and the substrate current to be increased.

SUMMARY OF THE INVENTION

An object of the present invention is to provide a semiconductor device including a vertical type bipolar transistor and a lateral type bipolar transistor which has a conductivity type different from that of the vertical type bipolar transistor and has an improved current amplification factor ($h_{FE}$) without influence on the characteristics of the vertical type bipolar transistor and a method of fabricating the same without increase of the number of fabrication steps.

In order to achieve the above object, a semiconductor device according to the present invention comprises a semiconductor substrate of a first conductivity type, a vertical type bipolar transistor having a base region of said first conductivity type and formed in said semiconductor substrate, a lateral type bipolar transistor having a base region of a second conductivity type opposite to said first conductivity type and formed in said semiconductor substrate, a collector region of said first conductivity type, and a emitter region of said first conductivity type, and an insulating diffusion region of said first conductivity type for isolating between said vertical and lateral type bipolar transistors, at least one of said collector and emitter regions having substantially same depth of said insulating diffusion region.

A thick oxide film is selectively grown on a base diffusion surface of the lateral type bipolar transistor and the collector region of the first conductivity type is deeper than the oxide film.

Further, according to the present invention, a method of fabricating a semiconductor device comprising a semiconductor substrate of a first conductivity type, a vertical type bipolar transistor having a base region of the first conductivity type and formed in the semiconductor substrate and a lateral type bipolar transistor having a base region of a second conductivity type and formed in the semiconductor substrate is featured by that a collector diffusion layer of the first conductivity type of the vertical type bipolar transistor or the collector diffusion layer and an emitter diffusion layer of the first conductivity type are formed by ion-injecting an impurity of the first conductivity type with using a thick oxide film selectively grown on a surface of a base region of the second conductivity type of the lateral type bipolar transistor as at least a portion of a mask and then heat-treating it.

Therefore, the minority carrier injected from the emitter is efficiently captured by forming the collector diffusion layer of the lateral type bipolar transistor as deep as possible in a range with which an appropriate breakdown voltage is obtained and high current amplification factor $h_{FE}$ is obtained by converting the minority carrier into a collector current.

Since the collector diffusion layer of the lateral type bipolar transistor is formed in the same step for forming the insulating diffusion layer for element separation, it becomes possible to improve the current amplification factor $h_{FE}$ of the lateral type bipolar transistor without increase of the number of fabrication steps.

Further, since the collector diffusion layer of the lateral type bipolar transistor is formed before the formation of the base and the emitter of the vertical type bipolar transistor independently therefrom, the formation of the deep collector diffusion layer is facilitated without influencing the characteristics of the vertical type bipolar transistor.

Further, since the LOCOS oxide film exists on the surface of the base region of the lateral type bipolar transistor and there is no polycrystalline silicon thereon, the leakage current due to such as surface inversion is not produced.

DETAILED DESCRIPTION OF THE PREFERRED EMBODIMENTS

Figure 1A:
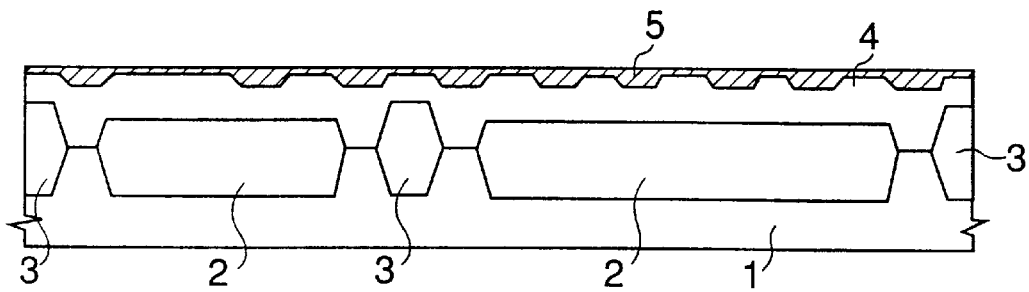
FIGS. 1(a) to 1(d) are cross sections of a semiconductor device according to a first embodiment of the present invention, showing a fabrication steps thereof.
Figure 1B:
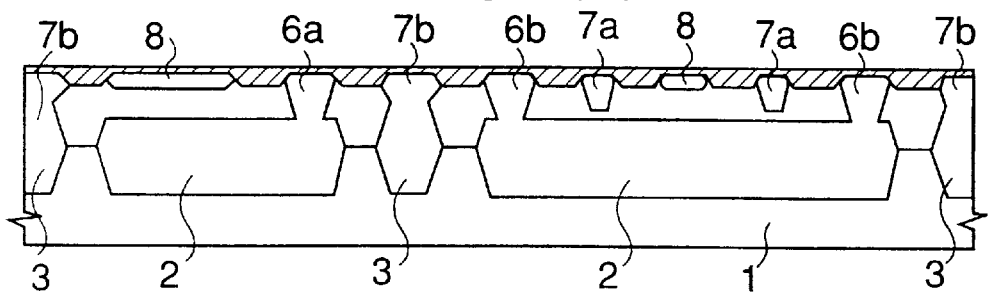
Figure 1C:
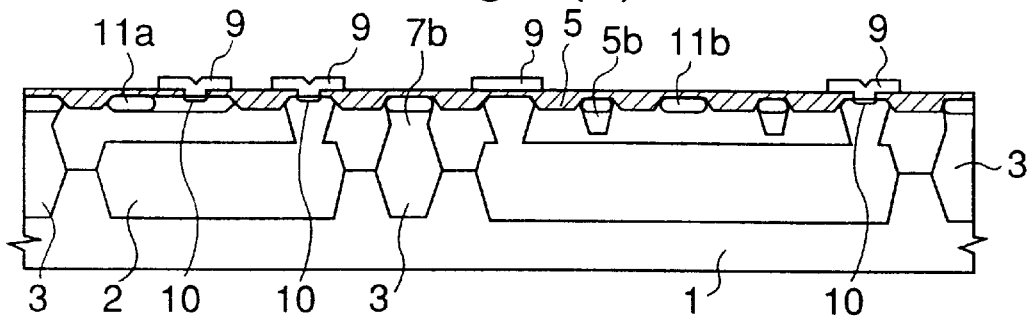
Figure 1D:
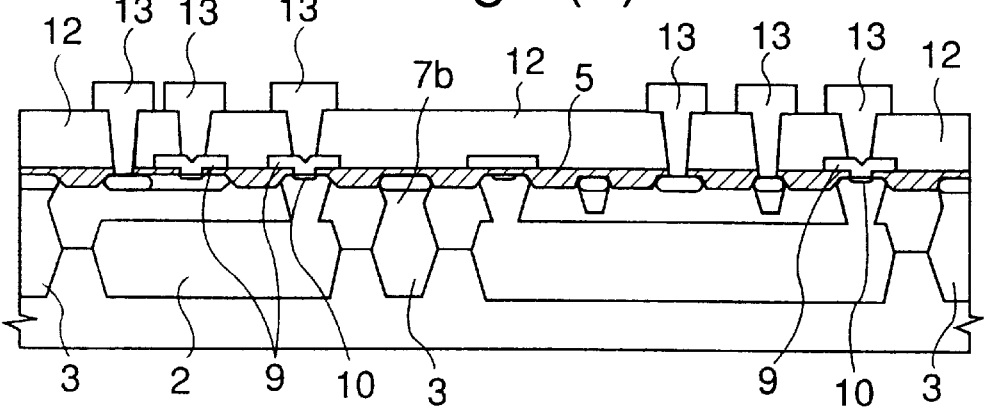

Preferred embodiments of the present invention will be described in detail with reference to the drawings.

FIGS. 1(a) to 1(d) are cross sections of a semiconductor device according to a first embodiment of the present invention, showing a fabrication steps thereof.

In FIGS. 1(a) to 1(d), the semiconductor device according to the present invention comprises a semiconductor substrate of a first conductivity type, a vertical type bipolar transistor formed on the semiconductor substrate and having a base region of the first conductivity type and a lateral type bipolar transistor formed on the semiconductor substrate and having a base region of a second conductivity type, wherein a collector region of the first conductivity type or the collector region and an emitter region of the first conductivity type and an insulating diffusion region of the first conductivity type for isolating between the vertical and lateral type bipolar transistors have substantially the same impurity density and are formed in substantially the same depth.

The collector diffusion layer of the first conductivity type of the lateral type bipolar transistor or the collector diffusion layer and an emitter diffusion layer of the first conductivity type of the lateral type bipolar transistor and the insulating diffusion layer of the first conductivity type for separating the transistors have the same impurity density and the same depth.

Further, according to the present invention, a method of fabricating a semiconductor device comprising a semiconductor substrate of a first conductivity type, a vertical type bipolar transistor having a base region of the first conductivity type and formed in the semiconductor substrate and a lateral type bipolar transistor having a base region of a second conductivity type and formed in the semiconductor substrate is featured by that a collector diffusion layer of the first conductivity type of the vertical type bipolar transistor or the collector diffusion layer and an emitter diffusion layer of the first conductivity type are formed by ion-injecting an impurity of the first conductivity type with using a thick oxide film selectively grown on a surface of a base region of the second conductivity type of the lateral type bipolar transistor as at least a portion of a mask and then heat-treating it.

Now, a method for fabricating the semiconductor device according to the first embodiment will be described in detail. First, as shown in FIG. 1($a$), an $N^+$ type buried layer 2 which becomes a collector region of an NPN transistor as well as a base region of an L-PNP transistor and a $P^+$ type buried layer 3 which becomes an isolation region for elements are formed in a $P^{31}$ type silicon substrate 1 having impurity density of $1 \times 10^{15}$ cm$^{-3}$. The $N^+$ type buried layer 2 is formed by injecting arsenide ion with injection energy of 70 KeV and dose of 5E15 cm$^{-2}$ and then heat-treating the wafer in nitrogen atmosphere for 4 hours. The $P^+$ type buried layer 3 is formed by injecting boron ion with injection energy of 70 KeV and dose of 1E14 cm$^{-2}$ and then heat-treating the wafer in nitrogen atmosphere at 1000° C. for 1 hour.

Then, an $N^-$ type epitaxial layer 4 having impurity density of $5 \times 10^{15}$ cm$^{-3}$ is grown on the whole surface of the silicon substrate 1 to a thickness of 2.1 $\mu$m. In this case, the $N^+$ type buried layer 2 is risen in the epitaxial layer 4 by about 0.7 $\mu$m. That is, the thickness of the intrinsic epitaxial layer 4 becomes about 0.9 $\mu$m. On the other hand, the $P^+$ type buried layer 3 is risen by as large as about 1.3 $\mu$m.

Then, a LOCOS oxide film 5 having thickness of 5000 Å is formed by selective oxidation. In this case, the LOCOS oxide film is also formed on a surface of the wafer which becomes the base region of the L-PNP transistor.

Then, as shown in FIG. 1($b$), an $N^+$ type collector lead diffusion layer 6$a$ of the NPN transistor and an $N^+$ type base lead diffusion layer 6$b$ of the L-PNP transistor are formed. The $N^+$ type collector lead diffusion layer 6$a$ of the NPN transistor and the $N^+$ type base lead diffusion layer 6$b$ of the L-PNP transistor are formed by injecting phosphor ion into the wafer with injection energy of 70 KeV and dose of 5E15 cm$^{-2}$ and then heat-treating the wafer at 1100° C. for 40 minutes such that these diffusion layers reach the $N^+$ type buried layer 2.

Then, a $P^+$ type collector diffusion layer 7$a$ of the L-PNP transistor and a $P^+$ type isolation diffusion layer 7$b$ are formed. The $P^+$ type collector diffusion layer 7$a$ of the L-PNP transistor and the $P^+$ type isolation diffusion layer 7$b$ are formed by injecting boron ion into the wafer with injection energy of 30 KeV and dose of 2E15 cm$^{-2}$ and then heat-treating the wafer at 1100° C. for 20 minutes such that these diffusion layers become about 1.0 $\mu$m deep and buried. With this procedure, the $P^+$ type buried layer 3 which is risen and the $P^+$ type isolation diffusion layer 7$b$ are connected to each other, making an element isolation possible.

Then, in order to form a P type base diffusion layer 8 of the NPN transistor, boron is ion-injected into the whole surface of the wafer with injection energy of 20 KeV and dose of $2 \times 10^{13}$ cm$^{-2}$, without necessity of using photolithography for selective ion-injection. This is because the conductivity type of all of other portions of the wafer than the region which becomes the base of the NPN transistor and the region in which the emitter of the L-PNP transistor is formed and having no LOCOS oxide film thereon are converted from $N^+$ type to $P^+$ type and the impurity density and polarity thereof are substantially not influenced by injection of P type impurity of middle density. Needless to say, the LOCOS oxide film is an insulator even if boron is injected thereinto.

Then, as shown in FIG. 1($c$), a portion of the oxide film on a surface of the P type base region is removed to open holes and then a polycrystalline silicon layer 9 is grown therethrough to a thickness of 2000 Å. After arsenide is ion-injected to the wafer with injection energy of 70 KeV and dose of 1E16 cm$^{-2}$, the wafer is treated with nitrogen at 900° C. for 10 minutes, resulting in the $N^+$ type emitter diffusion layer and $N^+$ type base diffusion layer 10.

Thereafter, the $N^+$ type polycrystalline silicon layer 9 is treated by using photolithography and anisotropic plasma etching technology such that the $N^+$ type polycrystalline silicon layer 9 is left on the $N^+$ type emitter diffusion layer 10, an area surrounding the latter, the $N^+$ type collector lead diffusion layer and the $N^+$ type base lead diffusion layer.

Further, a $P^+$ type graft base diffusion layer 11$a$ of the NPN transistor and a $P^+$ type emitter diffusion layer 11$b$ of the L-PNP transistor are formed by ion-injecting BF$_2$ to the whole surface of the silicon substrate 1 with injection energy of 70 KeV and dose of 5E15 cm$^{-2}$.

Finally, as shown in FIG. 1($d$), a usual inter-layer insulating film such as a BPSG film 12 is grown to a thickness of 1.0 $\mu$m and an aluminum wiring layer 13 is formed by forming contact holes in the BPSG film 12, completing the semiconductor device.

Figure 2:
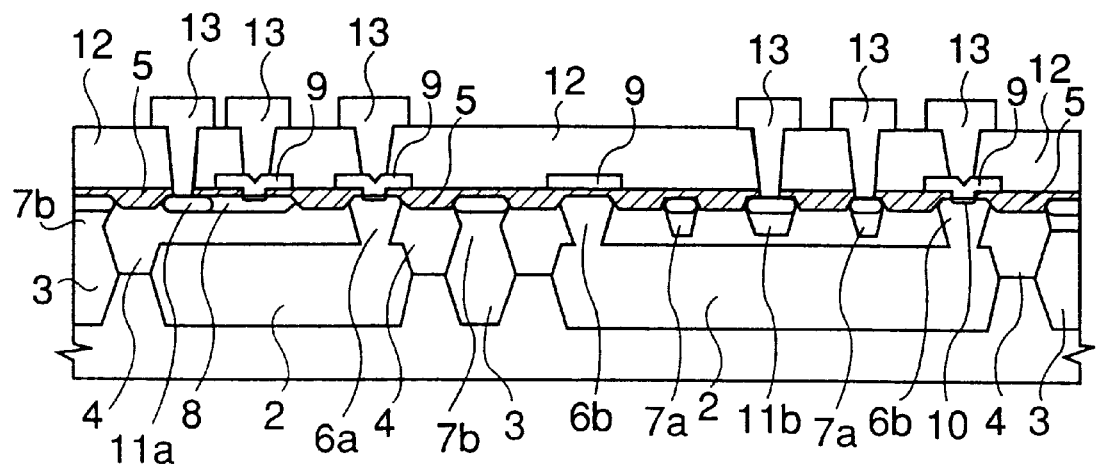
FIG. 2 is a cross section of a semiconductor device according to a second embodiment of the present invention.
Figure 3:
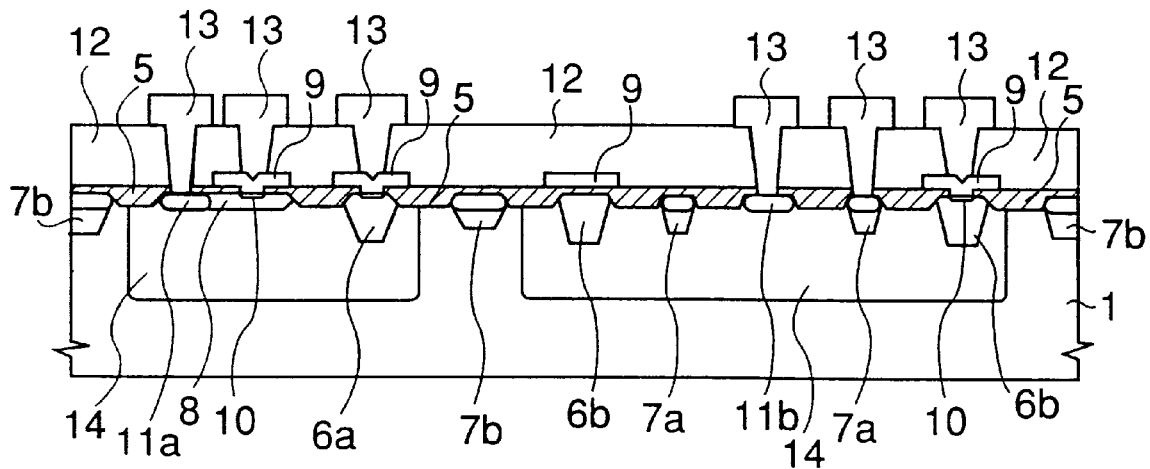
FIG. 3 is a cross section of a semiconductor device according to a third embodiment of the present invention.
Figure 4A:
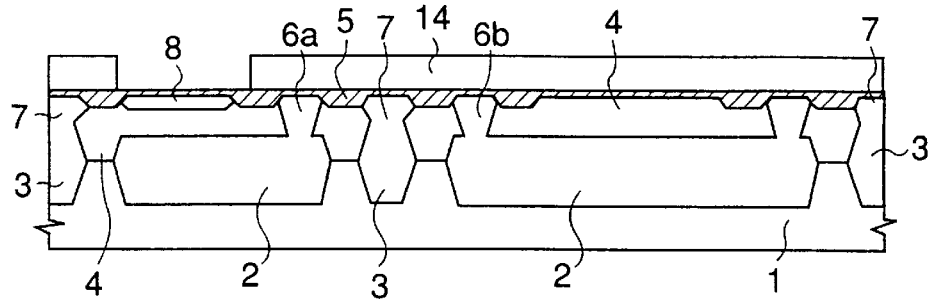
FIGS. 4(a) to 4(d) are cross sections of a conventional semiconductor device, showing a fabrication steps thereof.
Figure 4B:
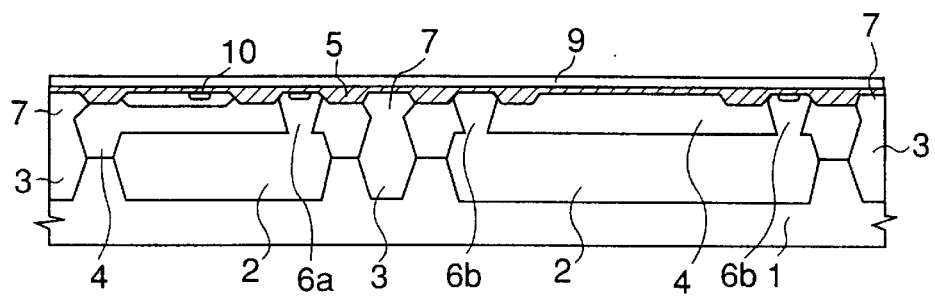
Figure 4C:
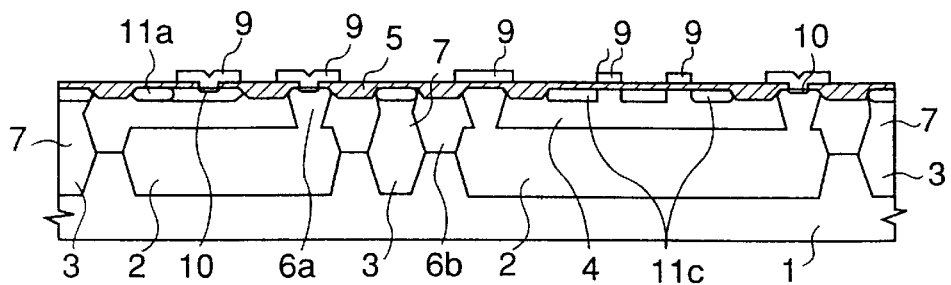
Figure 4D:
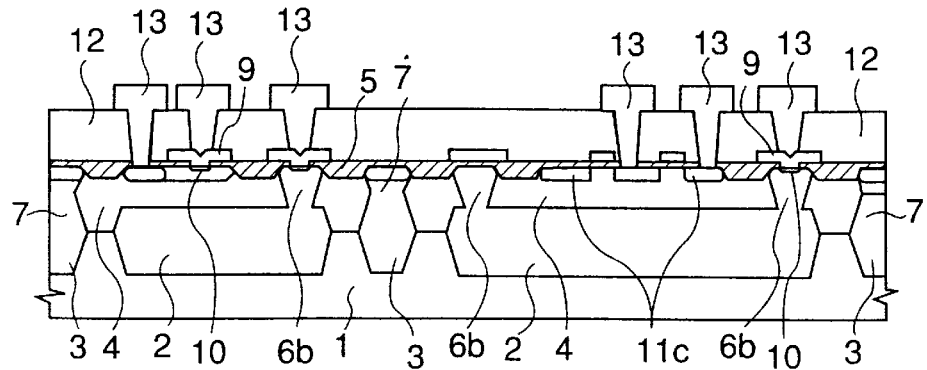

FIG. 2 is a cross section of a semiconductor device according to the second embodiment of the present invention.

In the second embodiment shown in FIG. 2, the $P^+$ type emitter diffusion layer 11$b$ of the L-PNP transistor which is deep is formed simultaneously with formation of the $P^+$ type collector diffusion layer 7$a$. Therefore, it is possible to further improve the current amplification factor $h_{FE}$ of the L-PNP transistor compared with the first embodiment. However, it should be noted that an area of the transistor cell is slightly increased correspondingly to the degree of lateral broadening of the $P^+$ type emitter diffusion layer. This is because the deep collector diffusion layer of the lateral type bipolar transistor is formed in the same fabrication step as that of the formation of the insulating diffusion layer, before the emitter diffusion layer of the vertical type bipolar transistor is formed.

Further, in performing the impurity ion-injection for forming the base region of the vertical type bipolar transistor, the photolithographical step for selectively injecting impurity can be removed. This is because the LOCOS oxide film is formed on the surface of the base region of the lateral type bipolar transistor.

What is claimed is:

1. A method for fabricating a semiconductor device comprising:

forming a first buried layer of a first conductivity type on a semiconductor substrate of a second conductivity type;

forming a second buried layer of a second conductivity type on said semiconductor substrate;

forming an epitaxial layer of said first conductivity type on said first buried layer, said second buried layer and said semiconductor substrate, wherein a first impurity of said first buried layer diffuses into said epitaxial layer to form an expanded first buried layer having an upper surface with a first depth from a surface of said epitaxial layer, and a second impurity of said second buried layer diffuses into said epitaxial layer to form an expanded second buried layer having an upper surface with a second depth from said surface of said epitaxial layer shallower than said first depth;

forming a first diffusion layer of said second conductivity type from said surface of said epitaxial layer to said upper surface of said second buried layer, and a second diffusion layer of said second conductivity type in a first portion which is above said layer; first buried forming a third diffusion layer of said first conductivity type from said surface of said epitaxial layer to said first buried layer; and forming a fourth diffusion layer of said second conductivity type formed in a second portion which is above said first buried layer.

2. A method for fabricating a semiconductor device comprising:

forming a first buried layer of a first conductivity type on a first area of a semiconductor substrate of a second conductivity type, and a second buried layer of said first conductivity type on a second area of said semiconductor substrate;

forming a third buried layer of said second conductivity type between said first area and said second area;

forming an epitaxial layer of said first conductivity type on said first buried layer, said second buried layer, said third buried layer and said semiconductor substrate, wherein a first impurity of said first buried layer diffuses into said epitaxial layer to form an expanded first buried layer having an upper surface with a first depth from a surface of said epitaxial layer, a second impurity of said second buried layer diffuses into said epitaxial layer to form an expanded second buried layer having an upper surface with said first depth from a surface of said epitaxial layer, and a third impurity of said third buried layer diffuses into said epitaxial layer to form an expanded third buried layer having an upper surface with a second depth from said surface of said epitaxial layer shallower than said first depth;

forming a first diffusion layer of said first conductivity type from said surface of said epitaxial layer to said upper surface of said second buried layer, and a second diffusion layer of said second conductivity type in a first portion which is above said first buried layer;

forming a third diffusion layer of said first conductivity type from said surface of said epitaxial layer to said first buried layer;

forming a fourth diffusion layer of said second conductivity type formed in a second portion which is above said first buried layer; and forming a fifth diffusion layer of said second conductivity type formed above said second buried layer.

* * * * *